United States Patent [19]

Bonaccio et al.

[11] Patent Number: 5,043,674
[45] Date of Patent: Aug. 27, 1991

[54] DIFFERENTIAL RECEIVER WITH HIGH COMMON-MODE RANGE

[75] Inventors: Anthony R. Bonaccio, Shelburne; John E. Gersbach, Burlington, both of Vt.

[73] Assignee: International Business Machines Corporation, Armonk, N.Y.

[21] Appl. No.: 516,607

[22] Filed: Apr. 30, 1990

[51] Int. Cl.$^5$ .............................................. H03F 3/45
[52] U.S. Cl. .................................. 330/257; 330/253; 330/258
[58] Field of Search ................. 330/252, 253, 257, 258

[56] References Cited

U.S. PATENT DOCUMENTS

| | | | |
|---|---|---|---|
| 4,223,275 | 9/1980 | Brinker | 330/257 |
| 4,667,165 | 5/1987 | De Weck | 330/253 |
| 4,698,599 | 10/1987 | Hedman | 330/252 |
| 4,742,309 | 5/1988 | Chu | 330/258 |
| 4,748,420 | 5/1988 | Metz | 330/149 |
| 4,769,617 | 9/1988 | Mizuide | 330/260 |
| 4,887,047 | 12/1989 | Somerville | 330/257 |

OTHER PUBLICATIONS

John K. Moriarty, Jr., "A Serial Bus Transceiver for the Automotive Environment", IEEE Journal of Solid-State Circuits, vol. 23, No. 1, Apr. 1988, pp. 450-457.

Primary Examiner—James B. Mullins
Attorney, Agent, or Firm—Francis J. Thornton

[57] ABSTRACT

This describes a differential amplifier for producing an output current proportional to the differential input voltage regardless of the common-mode input voltage and comprises two identical voltage networks coupled between differential voltage inputs and to common differential current outputs and a common bias circuit. The described transmission line circuit operates as a transmission line receiver circuit with a high degree of common-mode rejection that will work in a high input signal voltage environment and in which both true and complement outputs can be developed such that their signal responses are additive and their common-mode responses subtractive. The circuit thus converts the input voltage to an input current while isolating the sensing circuit from common-mode input voltages which may be in excess of the breakdown voltage of the individual components of the circuit and the power supplies powering up the sensing circuit.

6 Claims, 4 Drawing Sheets

"5,043,674"

DIFFERENTIAL RECEIVER WITH HIGH COMMON-MODE RANGE

BACKGROUND OF THE INVENTION

This invention relates generally to transmission line receivers and more particularly to such receivers that have a high degree of common-mode rejection that will work in a high input signal voltage environment.

In the transmission of data between two physically separated computer systems the ground potential differential between the systems must be controlled within established limits. Each signal transferred between the machines is sent via a connecting cable comprising a pair of wires driven differentially by a driver circuit. At some distance down the connecting cable a receiver circuit is provided to sense the differential signal, provided by the driver, and to convert it to a single ended signal that will conform to the minimal accepted levels within the receiving system.

Since the driver circuit provides a signal referenced to its local ground and its power supply, the signal it sends to the receiver will appear at the receiver to experience a common-mode shift when the receiver reference, i.e. its own local ground and its own power supply is at a different level. The magnitude of this apparent shift is of course equal to the ground potential difference between the transmitting and the receiving systems. For example, a 7 volt maximum ground shift means that the receiving circuit must be able to sense differential signals in the range of hundreds of millivolts riding on a common-mode signal whose magnitude can be up to 7 volts outside the receiving circuit power supply voltage. Since the receiver circuit is usually provided with a single +5 voltage supply with respect to the local ground the receiver must be able to function over a common-mode range −7 volts to +12 volts with respect to its own local ground.

It is therefore imperative that a receiver circuit be available that has a high degree of common-mode rejection yet will operate over a wide signal voltage environment.

SUMMARY OF THE INVENTION

The present invention describes a unique circuit which generates an output with differential mode information and a high degree of common-mode rejection.

The receiver circuit of the invention basically comprises a differential amplifier for producing an output current proportional to the differential input voltage regardless of the common-mode input voltage. This is accomplished in the present invention by identical first and second voltage networks, having a common bias circuit. These voltage networks are each coupled to a differential voltage input and each is coupled in common to the same primary current outputs. The receiver circuit of the present invention performs two distinct functions for it not only receives and senses the differential signals provided but converts them to single ended signals that conform to the minimum acceptable logic level within the computer system to which it is transmitting the information. Thus, the invention solves the problem of sensing small differential voltage signals in the presence of common-mode signals whose magnitude may exceed the power supply level to the sensing circuit and also exceeds the breakdown voltages of the component devices used to fabricate the receiving circuit.

These and other general and specific objects, advantages and aspects of the invention will become apparent when reference is made to the following detailed description considered in conjunction with the accompanying drawings.

DETAILED DESCRIPTION OF THE PREFERRED EMBODIMENT

Figure 1:
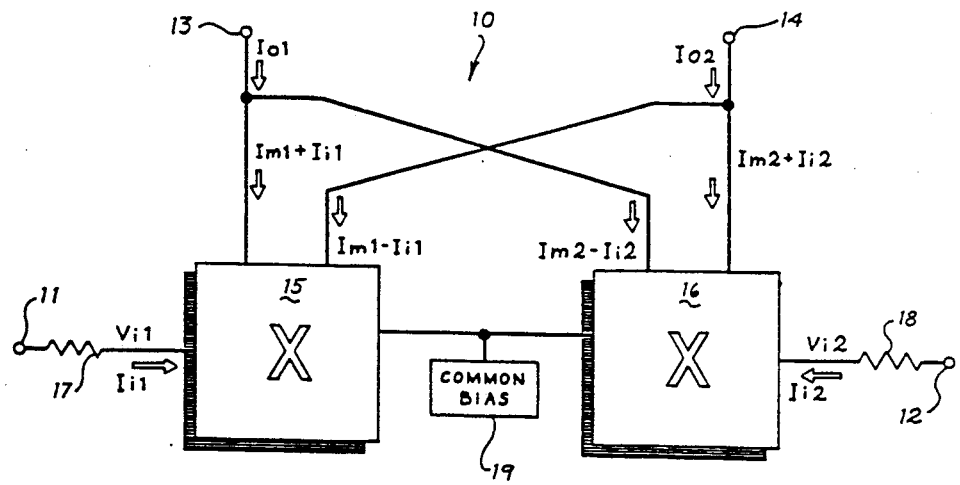
FIG. 1 is a schematic view of the general concept of the present circuit.

Referring now to the drawings, and especially to FIG. 1, there is shown in schematic form of the receiver 10 of the present invention which is provided with differential voltage inputs 11 and 12 and two current output lines 13 and 14. In essence the receiver, of the present invention, can further be considered as two identical networks 15 and 16 each of which is coupled to a respective one of the differential voltage inputs and commonly to the two output lines 13 and 14. Thus network 15 is coupled to voltage line 11 and to current output lines 13 and 14. Similarly, network 16 is coupled to voltage line 12 and to current output lines 13 and 14. Each network 15 or 16 is designed with a respective resistive input impedance 17 and 18 so that the currents $I_{i1}$ and $I_{i2}$ flowing into the inputs 11 and 12 respectively will be proportional to the voltages received at these inputs 11 and 12. In this way two output currents $I_{o1}$ and $I_{o2}$ are generated, one being equal to $I_m + I_i$ and the other equal to $I_m - I_i$ where $I_m$ is some minimum current bias level whose value is set by other circuit constraints. By utilizing a common bias generator circuit 19 as shown in FIG. 1, the value of current $I_m$ for both networks is essentially set and controlled. This, in turn, helps to set and control the value of the common-mode component of each output current, an important feature of the present invention. By connecting the networks 15 and 16 in common to both outputs 13 and 14, as shown in FIG. 1, a differential output current whose value is proportional to differential input voltage is generated. Thus:

$$I_{o1} = I_{m1} + I_{i1} + I_{m2} - I_{i2}$$

$$I_{o2} = I_{m2} + I_{i2} + I_{m1} - I_{i1}$$

$$I_{diff}OUT = I_{o2} - I_{o1}$$

$$I_{diff}OUT = I_{m2} + I_{i2} + I_{m1} - I_{m1} - I_{i1} - I_{m2} - I_{i2}$$

$$I_{diff}OUT = 2(I_{i2R} - I_{i1})$$

thus $I_{diff}OUT$ is proportional to $$V_{i2} - V_{i1}$$

Figure 2:
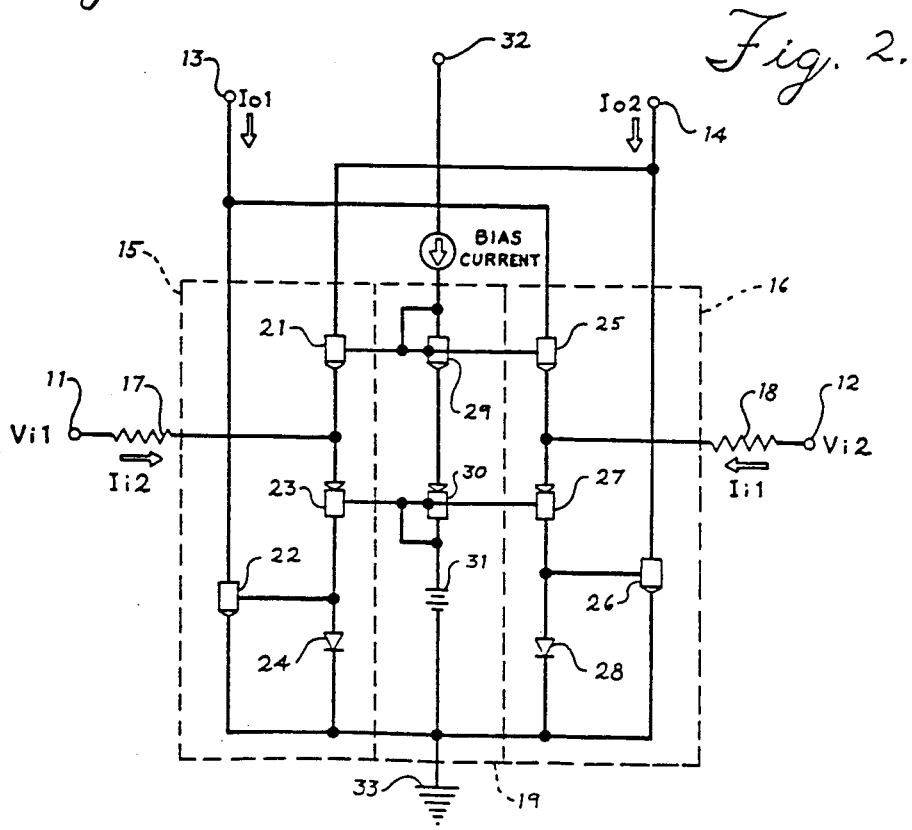
FIG. 2 is a schematic of one of the embodiments of the present invention.

FIG. 2 shows a detailed schematic of one embodiment of the invention. In this Fig. each of the two cross-coupled networks 15 and 16, are illustrated more specifically as comprising a pair of NPN transistors, a PNP transistor and a diode. Network 15 comprises NPN transistors 21 and 22, PNP transistor 23, and diode 24 while network 16 comprises NPN transistors 25 and 26, PNP transistor 27, and diode 28. The common bias circuit 19 comprises an NPN transistor 24 and a reference voltage source 31 coupled between a voltage source 32 and a ground connection 33.

An additional concept critical to the actual circuit and limitation of each network 14 or 15 is the portion of the network that creates the input current which is proportional to the input voltage. The network sees the full common-mode voltage range applied to the input and therefore must be capable of functioning over that range without junction breakdown in its transistors. This is most easily achieved by connecting a resistor between the input and some low impedance voltage reference point whose value is chosen to be somewhere between ground and the receiver circuits power supply.

In integrated circuit technology where the entire circuit is to be created in a single semiconductor chip, this resistor can be built as a diffusion resistor in an isolated well which floats with respect to ground. The breakdown value of this diffused resistor limits the input voltage level. Since the resistor is connected between the input and the low impedance internal reference it effectively isolates the rest of the network from the input with its high common-mode potential. The input current in the resistor is:

$$I_i = (V_i - V_R)/R$$

where R is effectively the constant of proportionality. The $V_r$ term, because its sign is negative, cancels out of the equations above leaving the result for the differential output current unchanged.

Transistors 21, 23, 25 and 27 are all emitter follower transistors which generate the required low impedance reference voltage for the input resistors 17 and 18 respectively. These input resistors 17 and 18 are shown as coupled respectively to the input nodes 11 and 12. Diode 24 and NPN transistor 22 are connected to function as a current mirror reflecting the current in PNP transistor 23. Diode 28 and NPN transistor 26 also function as a current mirror and reflect the current in PNP transistor 27.

The described circuit operates as follows. Initially no differential voltage signal is applied to nodes 11 and 12, i.e., the differential between the inputs 11 and 12 is zero, and the common-mode component is set equal to the potential at the emitter of diode 30. Then the input currents $I_1$, at input 11 and $I_2$ at input 12, are zero and the currents in each network, i.e. 21, 22, 23, 25, 26 and 27, are equal one to another. For example, if we assume that the voltages and currents at nodes 11 and 12 are equal in value then the only current flow through the circuit is $I_m$. As the input signal takes on a differential, i.e., the levels applied to inputs 11 and 12 begin to diverge, the collector currents of transistors 21 and 26 begin to differ in proportion to the difference in voltage applied to input nodes 11 and 12, i.e., $V_1$ at node 11 and $V_2$ at node 12.

$$V_{i1} = V_{cm} + V_{dm}/2$$

$$V_{i2} = V_{cm} - V_{dm}/2$$

$$I_{i1} = (V_{cm} - V_{dm}/2 - V_R)/R$$

$$I_{i2} = (V_{cm} - V_{dm}/2 - V_R)/R$$

$$I_{diff}OUT = V_{dm}/R$$

If for example input 11 is more positive than input 12 then current flows from input 11 through transistor 23 and diode 24 to ground. Simultaneously, because input 12 is less positive than input 11 current is pulled through transistor 25 and out of input 12. Thus, less current flows through transistor 27 and diode 28. These actions cause node 13 to provide more current to the collector of transistor 25 and node 14 to deliver less current to the collector of transistor 21. Because of the increase in current through transistor 23 and diode 24 and because transistor 22 and diode 24 function as a current mirror transistor 25 also draws more current from node 13. In a similar fashion transistor 26 mirrors the current through diode 28 and draws less current from node 14. In this way node 13 reflects the voltage increase applied to mode 11 and node 14 reflects the voltage decrease applied to diode 12.

The circuit therefore produces an output current proportional only to the different mode input voltage while rejecting the common-mode input voltage. Simultaneously, the circuit elements are isolated from the common-mode swings at the input by the input resistors 22 and 23.

Figure 3:
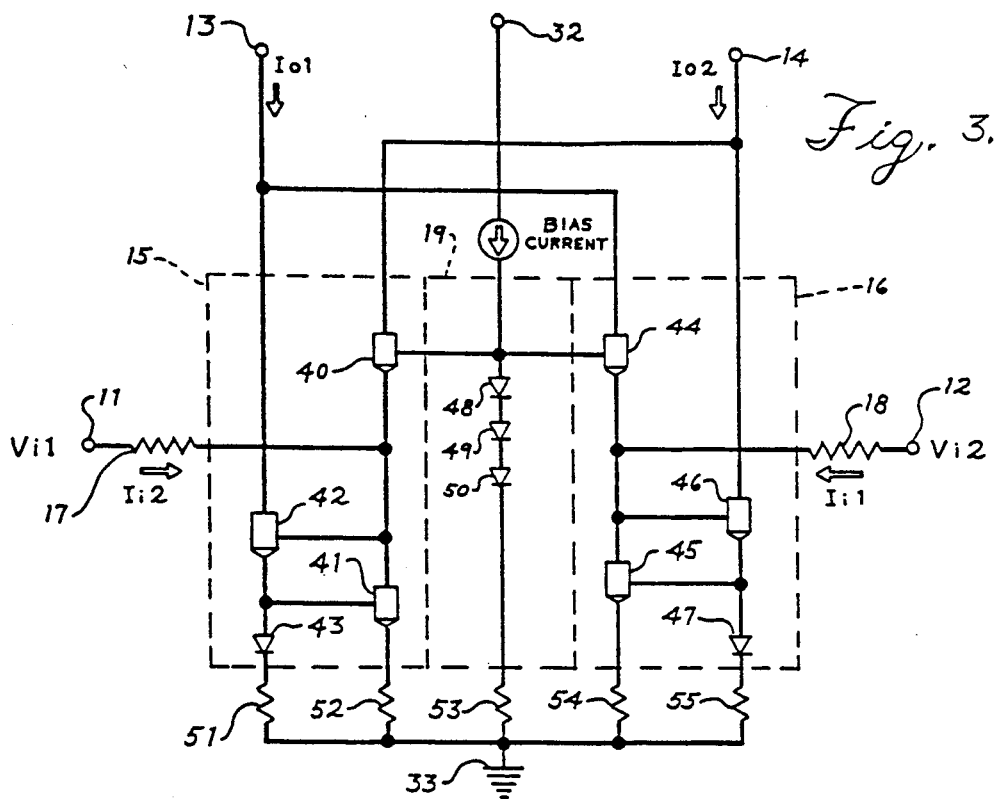
FIG. 3 shows the preferred embodiment of the invention using buffered NPN current mirrors.

Turning now to FIG. 3, the preferred embodiment of the invention will be described. This embodiment performs exactly the same function as set forth in FIG. 2, except it does it more efficiently. In the preferred embodiment the PNP transistor in the current mirror has been replaced with NPN devices and resistors have been added to minimize the effects of mismatch in those transistors. In this circuit the networks 15 and 16 each comprise three transistors and a diode. The PNP emitter followers, of FIG. 2 are replaced by buffered NPN current mirrors. Thus, for example, network 15 comprises transistors 40, 41 and 42 and diode 43 while network 16 comprises transistors 44, 45 and 46 and diode 47 and the bias circuit comprises bias diodes 48, 49 and 50. In this case the impedance seen by the input resistors 22 and 23 remains low due to the emitter follower at transistor 40 and the action of the negative feedback loop involving the buffered current mirror transistors 41 and 42. Resistors 51 and 52, in network 15, are added to minimize the effect of the $V_{be}$ mismatches in the NPN mirror transistors 41 and 42. The values of these resistors 51 and 52 are chosen such that the voltage drop $V_x$ across the resistor 52 is small enough so as to not permit saturation in any of the transistors in the circuit. The voltage bias to the emitter follower transistor 40 is provided by the three bias diodes 48, 49 and 50. The resistor 53 is added in this bias network to match the drop across resistor 51 and R5. Therefore, the nominal value of the reference potential $V_R$ at one end of the input resistor 22 is $2V_{be} + V_x$.

Thus, both circuits shown in FIGS. 2 and 3 generate a differential output current proportional to the differential input voltage. This of course is in itself insufficient for typically a differential out voltage is also required. In addition, the output current also has a common-mode component:

$$I_{ocm} = (I_{o1} + I_{o2})/2$$

which is dependent on the common-mode input voltage and must be accommodated. Several methods of resolving both of these problems can be identified. One straight forward method of doing so is to connect a standard PNP current mirror, i.e., comprising transistors 60, 61 and 62 and 63 and diode 65 as an active load. The output voltage can then be taken single endedly for example from output 14 or differentially from nodes 13 and 14. Although the differential output voltage is only half that achievable with a purely differential load.

Figure 4:
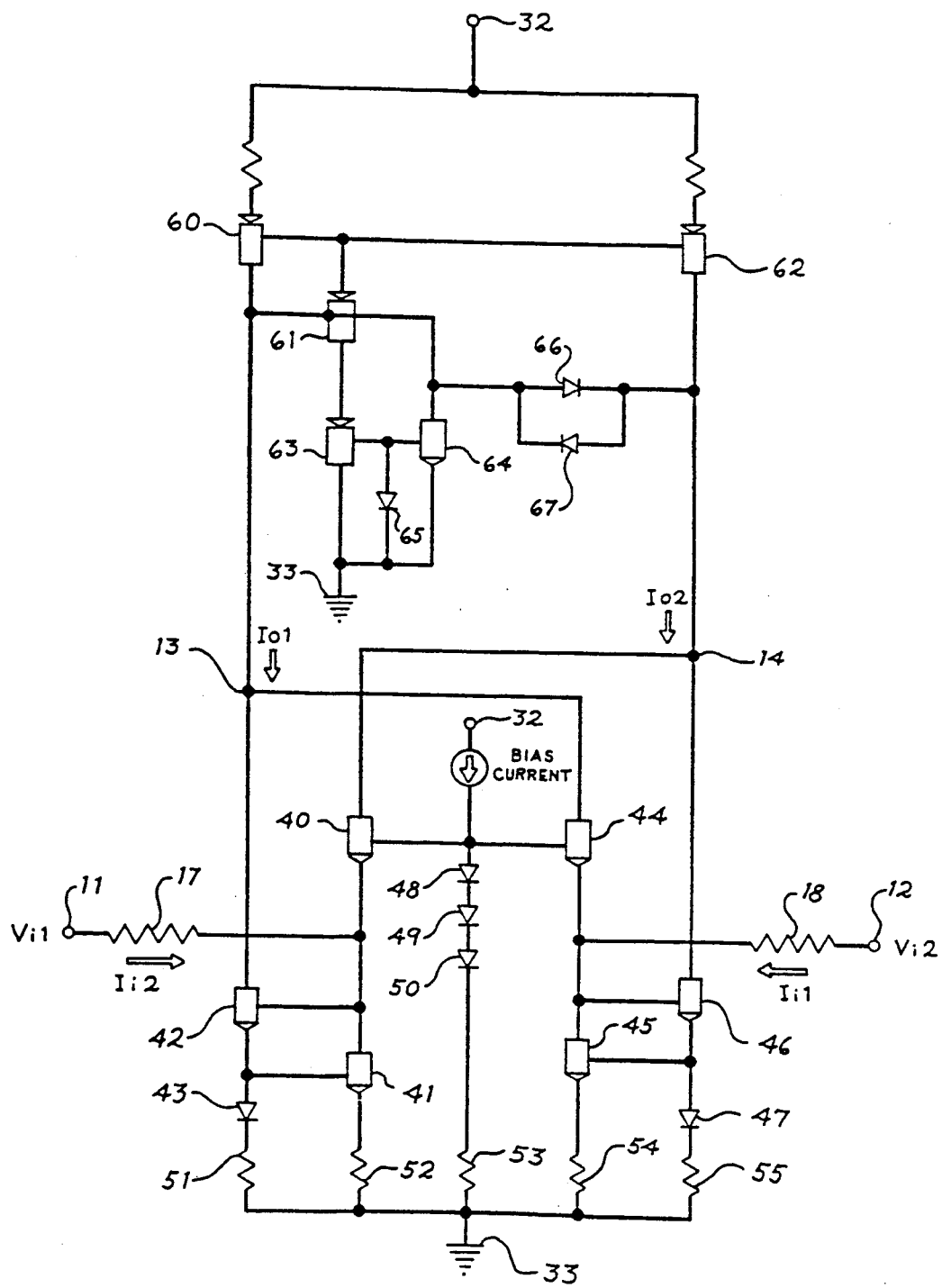
FIG. 4 shows the preferred embodiment of FIG. 3 with an active load coupled thereto.

A schematic of the sensing network of FIG. 3 loaded by such a circuit is shown in FIG. 4 and comprises the PNP current mirror as consisting of transistors 60, 61, 62, 63, 64 and diode 65. Since the output impedance of the PNP mirror set forth in FIG. 4 is large the voltage gain from the differential input to the single ended input is also large. Clamping diodes 66 and 67 can be added as shown in the circuit to the PNP current mirror to prevent saturation in the sensing network or in the current mirror itself. Also, because of the low forward current gain of typical integrated PNP transistors a base current compensation network, transistor 64, can be added to the NPN buffered transistor 61. Without this compensation network, the base current of the buffer transistor 61 which appears directly in one leg of the output of the sensing network, would be sufficient to create a significant offset in the DC voltage transfer characteristic.

Figure 5:
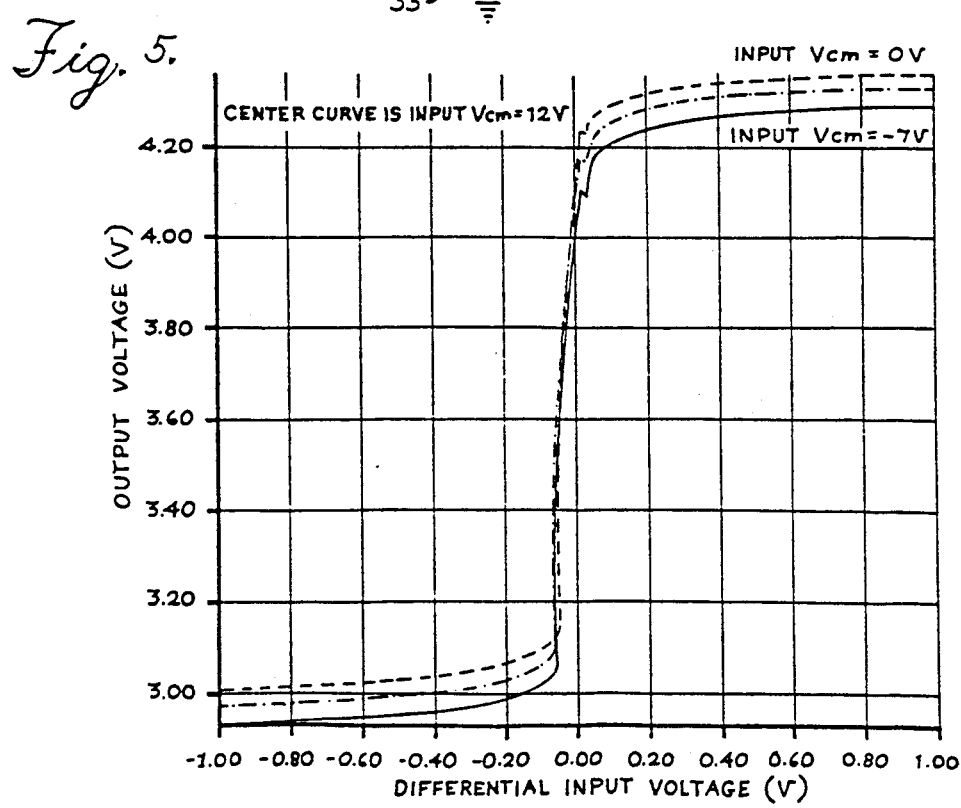
FIG. 5 shows a set of curves showing the DC transfer function of the circuit of FIG. 4.

The circuit of the invention and especially that as shown in FIG. 4, to which the active load has been applied, has been analyzed and a set of curves showing the DC transfer function of the circuit over the entire common-mode input range has been established and as shown as such in FIG. 5. It can readily been seen from this FIG. that the circuit operates over a wide range with minimal deviation.

It should be noted that the circuit described in this disclosure can be implemented in either field effect transistors or in the bipolar field effect transistor technology by simply replacing NPNs with N-type FETs and PNP transistors with the P-type FETs. In any event the concept and fundamental operations of the described circuits would remain identical.

Figure 6:
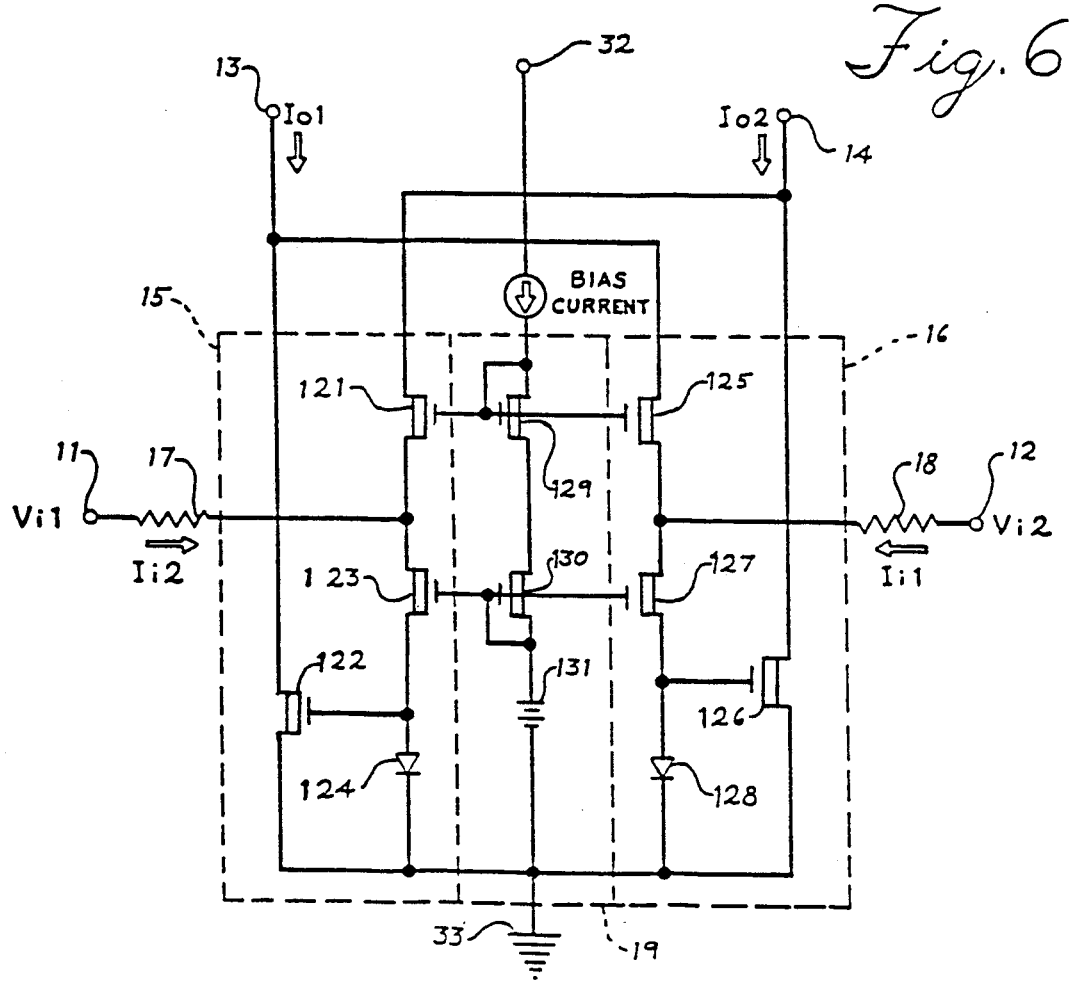
FIG. 6 shows a different embodiment of the invention employing field effect transistors.

FIG. 6 shows a detailed schematic of a field effect transistor embodiment of the invention. In this Fig. each of the two cross-coupled networks 15 and 16, are illustrated more specifically as comprising a pair of NFET transistors, a PFET transistor and a diode. Network 15 comprises NFET transistors 121 and 122, PFET transistor 123, and diode 124 while network 16 comprises NFET transistors 125 and 126, PFET transistor 127, and diode 128. The common bias circuit 19 comprises an NFET transistor 129, a PFET transistor 130, each of which is connected as a diode, and a reference voltage source 131 coupled between a voltage source 32 and a ground connection 33. Transistors 121, 123, 125 and 127 are all source follower transistors which generate the required low impedance reference voltage for the input resistors 17 and 18 respectively. These input resistors 17 and 18 are shown as coupled respectively to the input nodes 11 and 12. Diode 124 and NFET transistor 122 are connected to function as a current mirror reflecting the current in PFET transistor 123. Diode 128 and NFET transistor 126 also function as a current mirror and reflect the current in PFET transistor 127.

The described circuit operates generally as described in FIG. 2 above.

Having now described a unique circuit in which a differential output current can be derived as generated from a differential input voltage by cross coupling two identical networks and that the common-mode component of the output can be generated by using a common bias circuit for both of the networks and the input voltage can be converted to an input current while isolating the sensing circuit from the common-mode input voltages which may be in excess of the transistors breakdown and power supplies in the sensing circuit that the claims of the present invention should not be limited to the described embodiment but should be limited only by the appended claims wherein

We claim:

1. A differential amplifier circuit for producing an output current proportional to the differential input voltage regardless of the common-mode input voltage comprising:
    identical first and second voltage networks coupled between first and second differential voltage inputs and coupled to common differential current outputs, and
    to a common bias circuit,
    each of said networks being connected to a respective one of said differential voltage inputs through a respective input resistor, and to respective one of said differential current outputs and cross coupled to the other one of said differential current outputs and containing a current mirror consisting of a current mirror transistor, directly coupled to the said other one of said outputs, and a diode, and transistor means for generating an impedance reference voltage for the respective input resistor coupled to said network, said transistor means being further coupled to said respective one of said outputs and said current mirror,
    a load circuit coupled to the current outputs, and
    said common bias circuit coupled to said first and second networks consisting of a plurality of diodes and a constant current source coupled between a pair of supply voltages.

2. The differential amplifier of claim 1 wherein said transistor means comprises a pair of serially arranged emitter follower transistors, and one of said emitter follower transistors is a NPN device and the other of said emitter follower transistors is a PNP device.

3. The differential amplifier of claim 1 wherein said transistor means comprises a pair of serially arranged source follower transistors and one of said source follower transistors is a NFET device and the other of said source follower transistors is a PFET device.

4. A differential amplifier circuit for producing an output current proportional to a differential input voltage regardless of the common-mode input voltage comprising;
    first and second voltage networks each coupled to respective first and second supply voltages, to respective first and second differential voltage inputs, and to first and second differential current outputs, and
    a common bias circuit connected to both networks,
    each of said networks comprising an emitter follower transistor having its collector coupled to one of said outputs and its emitter coupled to a buffered current mirror, and to one of said differential voltage inputs through a resistor, said buffered current mirror comprising a first current mirror transistor and a second current mirror transistor and a diode, said first current mirror transistor having its collector coupled to the emitter of said emitter follower transistor and to the base of said second current mirror transistor, said second current mirror transistor having its collector coupled to said other of said outputs and its emitter connected to said diode and to the base of said first current transistor, said first current mirror transistor and said diode each being further coupled through a respective resistor to said one of said supply voltages, and said bias circuit means being coupled to the base of the said emitter follower transistor and comprising a plurality of semiconductor diodes and a resistor coupled between said first and second supply voltages.

5. The differential amplifier circuit of claim 4 wherein there is further provided an active load coupled thereto, said active load comprising an additional current mirror coupled to a pair of clamping diodes and to each of the said outputs whereby said clamping diodes prevent saturation in the networks.

6. The circuit of claim 5 wherein one of said supply voltages is ground.

* * * * *